US012690320B2

(12) United States Patent
Goshonoo

(10) Patent No.: US 12,690,320 B2
(45) Date of Patent: Jul. 21, 2026

(54) LED DISPLAY ELEMENT AND METHOD OF MANUFACTURING SAME

(71) Applicant: TOYODA GOSEI CO., LTD., Kiyosu (JP)

(72) Inventor: Koichi Goshonoo, Kiyosu (JP)

(73) Assignee: Toyoda Gosei Co., Ltd., Kiyosu (JP)

( * ) Notice: Subject to any disclaimer, the term of this patent is extended or adjusted under 35 U.S.C. 154(b) by 351 days.

(21) Appl. No.: 18/234,574

(22) Filed: Aug. 16, 2023

(65) Prior Publication Data

US 2024/0079441 A1 Mar. 7, 2024

(30) Foreign Application Priority Data

Sep. 1, 2022 (JP) ................................. 2022-138942

(51) Int. Cl.
H10H 29/14 (2025.01)
(52) U.S. Cl.
CPC ................................. H10H 29/142 (2025.01)
(58) Field of Classification Search
CPC ... H10H 29/142; H10H 20/034; H10H 20/833
See application file for complete search history.

(56) References Cited

U.S. PATENT DOCUMENTS

| | | | |
|---|---|---|---|
| 2012/0235204 A1* | 9/2012 | Hodota | ................ H10H 20/835 |
| | | | 257/E33.068 |
| 2020/0176655 A1 | 6/2020 | Iguchi et al. | |
| 2020/0365568 A1 | 11/2020 | Jang et al. | |
| 2021/0181398 A1 | 6/2021 | Emori et al. | |
| 2021/0305457 A1 | 9/2021 | Goshonoo | |
| 2023/0207538 A1 | 6/2023 | Jang et al. | |

FOREIGN PATENT DOCUMENTS

| | | |
|---|---|---|
| JP | 2003-017274 A | 1/2003 |
| JP | 2019-175710 A | 10/2019 |
| JP | 2020-088383 A | 6/2020 |
| JP | 2021-158179 A | 10/2021 |
| JP | 2022-532327 A | 7/2022 |

OTHER PUBLICATIONS

Japanese Office Action dated May 20, 2025 in Japanese Patent Application No. 2022-138942 with machine English translation.

* cited by examiner

*Primary Examiner* — Elias Ullah
(74) *Attorney, Agent, or Firm* — McGinn IP Law Group, PLLC

(57) ABSTRACT

A monolithic type LED display element includes: an n-layer; an active layer; a p-layer; an n-electrode; and p-electrodes, regions of the active layer facing the p-electrodes serve as light-emitting portions, and at least one of the p-electrodes or the n-electrode includes a low-reflection layer in which a transparent conductive film containing a transparent conductive oxide and a light-transmitting metal film capable of transmitting light are alternately laminated.

20 Claims, 15 Drawing Sheets

*FIG. 5*

| LAYER | MATERIAL | THICKNESS [nm] |
|---|---|---|
| 203 | Au | |
| 202C | Ti | 138.5 |
| 202B | ITO | 54.6 |
| 202A | Ti | 18.0 |
| 202B | ITO | 65.4 |
| 202A | Ti | 7.6 |
| 202B | ITO | 87.7 |
| 201 | Ti | 4.2 |
| | GaN | |

| LAYER | MATERIAL | THICKNESS[nm] |
|-------|----------|---------------|
| 203 | Au | |
| 202C | W | 160.5 |
| 202B | ITO | 314.6 |
| 202A | W | 56.6 |
| 202B | ITO | 44.5 |
| 202A | W | 7.5 |
| 202B | ITO | 84.0 |
| 201 | Ti | 5.6 |
| | GaN | |

| LAYER | MATERIAL | THICKNESS[nm] |
|-------|----------|---------------|
| 203 | Au | |
| 202C | Ta | 396.6 |
| 202B | ITO | 246.8 |
| 202A | Ta | 29.5 |
| 202B | ITO | 55.3 |
| 201 | V | 6.5 |
| | GaN | |

| LAYER | MATERIAL | THICKNESS[nm] |
|---|---|---|
| 203 | Au | |
| 202C | Ta | 100 |
| 202B | ITO | 246.8 |
| 202A | Ta | 29.4 |
| 202B | ITO | 55.3 |
| 201 | V | 6.5 |
| | GaN | |

| LAYER | MATERIAL | THICKNESS[nm] |
|---|---|---|
| 213 | Au | |
| | Pt | 100 |
| 212C | Ti | 100 |
| 212B | ITO | 162.6 |
| 212A | Ti | 19.5 |
| 212B | ITO | 169.6 |
| 212A | Ti | 21.4 |
| 212B | ITO | 53.3 |
| 212A | Ti | 12.6 |
| 212B | ITO | 54.0 |
| 212A | Ti | 4.7 |
| 211 | ITO | 100 |
| | GaN | |

| LAYER | MATERIAL | THICKNESS[nm] |
|-------|----------|---------------|
| 213   | Au       |               |
| 212C  | Ti       | 450.7         |
| 212B  | ITO      | 55.4          |
| 212A  | Ti       | 17.1          |
| 212B  | ITO      | 64.4          |
| 212A  | Ti       | 5.8           |
| 212B  | ITO      | 207.9         |
| 212A  | Ti       | 1.1           |
| 211   | ITO      | 100.0         |
|       | GaN      |               |

| LAYER | MATERIAL | THICKNESS[nm] |
|---|---|---|
| 213 | Au | |
| | Pt | 100.0 |
| 212C | Ti | 100.0 |
| 212B | ITO | 76.0 |
| 212A | Cr | 177.7 |
| 212B | ITO | 166.9 |
| 212A | Cr | 26.3 |
| 212B | ITO | 48.7 |
| 212A | Cr | 8.1 |
| 212B | ITO | 47.8 |
| 212A | Cr | 2.6 |
| 211 | ITO | 100.0 |
| | GaN | |

| LAYER | MATERIAL | THICKNESS[nm] |
|---|---|---|
| 213 | Au | |
| 212C | Cr | 177.7 |
| 212B | ITO | 166.9 |
| 212A | Cr | 26.3 |
| 212B | ITO | 48.7 |
| 212A | Cr | 8.1 |
| 212B | ITO | 47.8 |
| 212A | Cr | 2.6 |
| 211 | ITO | 100.0 |
| | GaN | |

LED DISPLAY ELEMENT AND METHOD OF MANUFACTURING SAME

CROSS-REFERENCE TO RELATED APPLICATION

This application is based on and claims priority under 35 USC 119 from Japanese Patent Application No. 2022-138942 filed on Sep. 1, 2022.

TECHNICAL FIELD

The present invention relates to an LED display element and a method of manufacturing the same.

BACKGROUND ART

In recent years, high definition of displays has been required, and a micro-LED display has attracted attention (JP2020-88383A). The micro-LED display is a display in which minute LEDs of the order of 1 μm to 100 μm are arranged in a matrix. One minute LED is one pixel or sub-pixel. For the micro-LED display, a structure in which micro-LEDs are individual chips and a monolithic structure in which a plurality of micro-LEDs are fabricated on one substrate are known (JP2020-88383A). The monolithic type is excellent in terms of miniaturization.

JP2022-532327A discloses that side surfaces and an upper surface of a light-emitting element are covered with a passivation layer made of a black epoxy molding compound. JP2022-532327A discloses that the passivation layer suppresses leakage of light from the side surfaces of the light-emitting element and suppresses interference of light from adjacent light-emitting elements.

SUMMARY OF INVENTION

However, the conventional monolithic type micro-LED has a problem that light emitted from an active layer or light from the outside is reflected at an interface of an electrode, resulting in a decrease in contrast and an undesired region appearing to emit light. For example, a pixel that is not emitting light appears to emit light due to reflection of light at the electrode or is not dark enough.

In addition, in the method of covering with the passivation layer as in JP2022-532327A, when pixels of the micro-LED display element are miniaturized, the effect is reduced. For example, if a semi-conductor layer is made continuous without dividing pixels with a groove for miniaturization of the pixels, the side surfaces of the light-emitting element cannot be covered, and the interference between the pixels cannot be sufficiently suppressed. In addition, as a result of miniaturizing the pixels, a ratio of an area of the electrode to the pixels increases, and therefore, a ratio of the passivation layer decreases and light cannot be sufficiently absorbed.

The present invention has been made in view of such a background, and an object of the present invention is to provide a monolithic type LED display element with improved contrast and a method of manufacturing the same.

An aspect of the present invention provides a monolithic type LED display element including an n-layer, an active layer, a p-layer, an n-electrode, and p-electrodes, in which regions of the active layer facing the p-electrodes serve as light-emitting portions, and at least one of the p-electrode or the n-electrode includes a low-reflection layer in which a transparent conductive film made of a transparent conductive oxide and a light-transmitting metal film capable of transmitting light are alternately laminated.

Another aspect of the present invention provides a method of manufacturing the LED display element according to the above aspect, the method including:

a combination setting step of setting a plurality of combinations of thicknesses of respective layers of the low-reflection layer;

an integration step of integrating, for the plurality of combinations, the reflectance of the p-electrode or the n-electrode provided with the low-reflection layer in a wavelength range of 400 nm to 700 nm and an incident angle range of 0° to 16°;

a minimum integrated value extraction step of extracting a minimum integrated value from a plurality of integrated values obtained in the integration step;

a combination extraction step of extracting the combination corresponding to an integrated value equal to or less than twice the minimum integrated value in the plurality of integrated values obtained in the integration step; and a forming step of forming the respective layers such that the thicknesses of the respective layers correspond to the combination extracted in the combination extraction step.

According to the LED display element and the method of manufacturing the same, since the reflection of light by the p-electrode and the n-electrode can be reduced, it is possible to suppress a decrease in the contrast of the display, and it is possible to prevent an undesired region from appearing to emit light.

BRIEF DESCRIPTION OF DRAWINGS

FIG. 5 is a diagram showing a manufacturing process of the LED display element of the first embodiment.

DETAILED DESCRIPTION OF THE INVENTION

An LED display element includes an n-layer, an active layer, a p-layer, an n-electrode, and p-electrodes. Regions of the active layer facing the p-electrodes serve as light-emitting portions. The LED display element constitutes a monolithic type in which the light-emitting portions are arranged. At least one of the p-electrodes or the n-electrode includes a low-reflection layer in which transparent conductive films made of a transparent conductive oxide and light-transmitting metal films capable of transmitting light are alternately laminated. For example, the LED display element may have a configuration in which a plurality of the light-emitting portions are arranged in a matrix. A thickness of the light-transmitting metal film is set to a thickness that allows light to pass through.

The low-reflection layer may include a light-impermeable metal film laminated on an opposite end of the n-layer.

In the low-reflection layer, the thickness of the light-transmitting metal film closest to the n-layer may be smaller than a thickness of the transparent conductive film closest to the n-layer.

The p-electrode may include a p-contact layer in contact with the p-layer, and the low-reflection layer laminated on the p-contact layer. In this case, a total thickness of the low-reflection layer laminated on the p-contact layer may be larger than that of the p-contact layer. The p-contact layer may be made of a transparent conductive oxide, and a layer in the low-reflection layer closest to the p-contact layer may be the light-transmitting metal film.

The n-electrode may include an n-contact layer in contact with the n-layer and the low-reflection layer laminated on the n-contact layer. In this case, a total thickness of the low-reflection layer laminated on the n-contact layer may be larger than that of the n-contact layer. The n-contact layer may be made of a metal, and a layer in the low-reflection layer close to the n-contact layer may be the transparent conductive film. The thickness of the light-transmitting metal film constituting the low-reflection layer laminated on the n-contact layer may be larger than that of the n-contact layer.

The transparent conductive film may be made of ITO or IZO.

The light-transmitting metal film may be made of at least one selected from Cr, Ir, Mo, Ni, Pt, Rh, Ta, Ti, V, W, and TiN.

First Embodiment

1. Overview of Element Configuration

Figure 1:
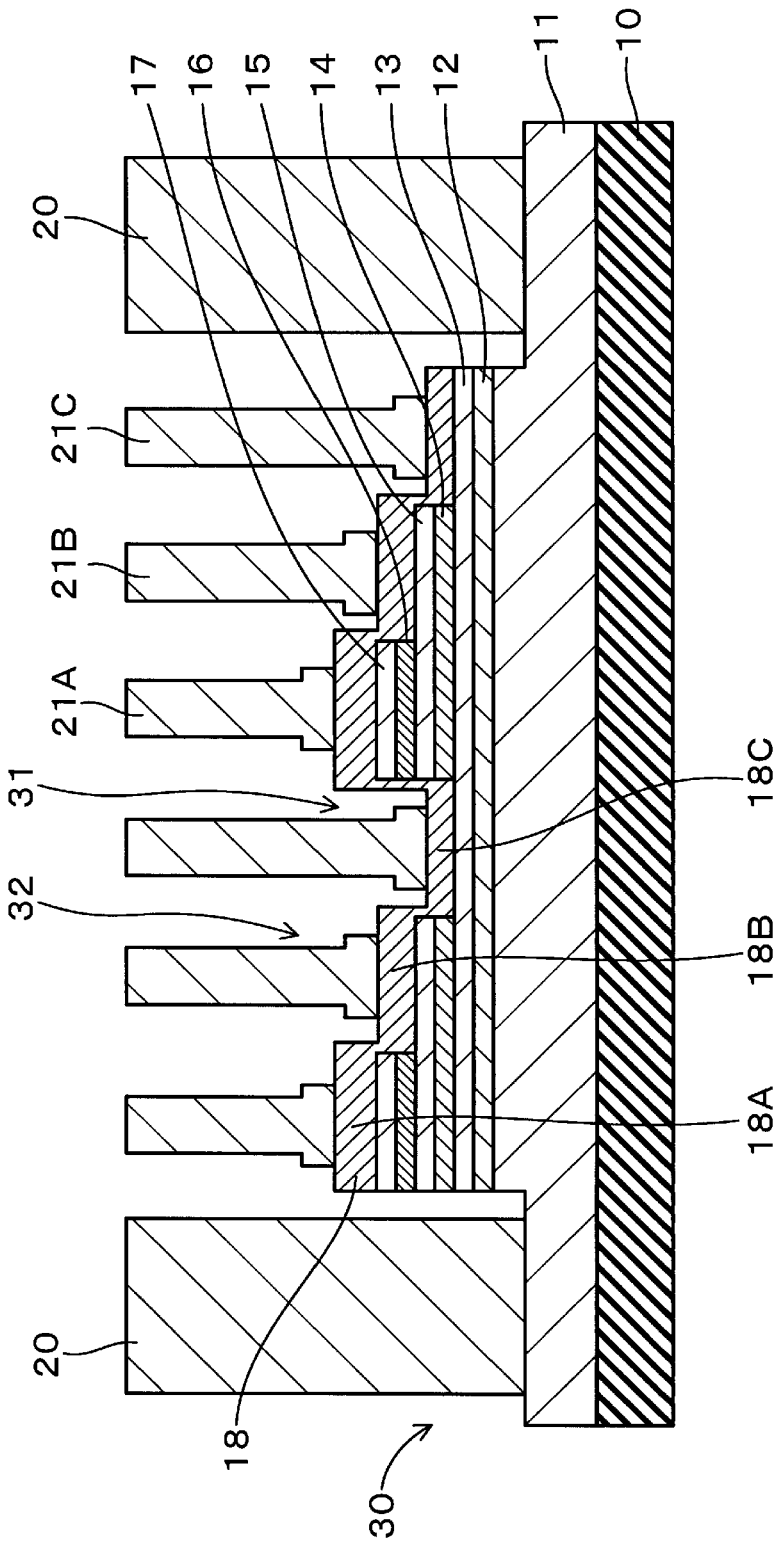
FIG. 1 is a diagram showing a configuration of an LED display element of a first embodiment.

FIG. 1 is a diagram showing a configuration of an LED display element of a first embodiment. The LED display element of the first embodiment is a monolithic type micro-LED display element made of a Group III nitride semiconductor. The monolithic type is a structure in which a plurality of light-emitting element structures are provided on the same substrate, and the light-emitting element structures are arranged in a matrix to form a display. The light-emitting element structure is one pixel in the display, and one pixel includes sub-pixels capable of emitting blue, green, and red light, respectively. The LED display element of the first embodiment is a flip-chip type that disperses light from a rear surface of a substrate, and is mounted on a mounting substrate (not shown) in a face-down manner. To simplify the description, the LED display element of the first embodiment is assumed to be a display of 2×2 pixels.

As shown in FIG. 1, the LED display element of the first embodiment includes a substrate 10, an n-layer 11, a first active layer 12, a first intermediate layer 13, a second active layer 14, a second intermediate layer 15, a third active layer 16, a protective layer 17, a p-layer 18, an n-electrode 20, and p-electrodes 21A to 21C.

2. Components

Next, configurations of the LED display element of the first embodiment will be described in more detail.

The substrate 10 is a growth substrate on which a Group III nitride semiconductor is grown. Examples thereof include sapphire. Si, and GaN.

The n-layer 11 is an n-type semi-conductor layer provided on the substrate 10 via a low-temperature buffer layer or a high-temperature buffer layer (not shown). However, the buffer layer may be provided as necessary, and may not be provided when the substrate is GaN. The n-layer 11 is, for example, n-GaN or n-AlGaN. A Si concentration is, for example, $1 \times 10^{18}$ cm$^{-3}$ to $100 \times 10^{18}$ cm$^{-3}$.

An ESD layer or an underlying layer may be provided on the n-layer 11. The ESD layer is provided to improve the electrostatic breakdown voltage. The ESD layer is, for example, non-doped or lightly Si-doped GaN, InGaN, or AlGaN. The underlying layer is a semi-conductor layer having a superlattice structure provided on the ESD layer, and is a layer for relaxing lattice strain of a semi-conductor layer formed on the underlying layer. The underlying layer is formed by alternately laminating group III nitride semi-conductor thin films (for example, two of GaN, InGaN, and AlGaN) having different composition ratios, and the number of pairs is, for example, 3 to 30. The underlying layer may be non-doped or doped with Si by about $1 \times 10^{17}$ cm$^{-3}$ to $100 \times 10^{17}$ cm$^{-3}$. The superlattice structure is not necessary if the strain can be relaxed. Any material may be used as long as a lattice constant difference is small at a hetero-interface with the first active layer 12. For example, an InGaN layer, an AlInN layer, or an AlGaIn layer may be used.

The first active layer 12 is a light-emitting layer of SQW or MQW structure provided on the n-layer 12. An emission wavelength is blue and is 430 nm to 480 nm. The first active layer 12 has a structure in which one to seven pairs of a barrier layer made of AlGaN and a well layer made of InGaN are alternately laminated. The number of pairs is more preferably 1 to 5, and further preferably 1 to 3.

The first intermediate layer 13 is a semi-conductor layer provided on the first active layer 12, and is positioned between the first active layer 12 and the second active layer 14. The first intermediate layer 13 is provided to enable light emission from the first active layer 12 and light emission from the second active layer 14 to be individually controlled. The first intermediate layer 13 also serves to protect the first active layer 12 from etching damage when forming second grooves 31 to be described later.

A material of the first intermediate layer 13 is GaN or InGaN. The first intermediate layer 13 may be non-doped, but is preferably doped with n-type impurities. For example, the Si concentration may be $1 \times 10^{17}$ cm$^{-3}$ to $1000 \times 10^{17}$ $cm^{-3}$, preferably $10 \times 10^{17}$ $cm^{-3}$ to $100 \times 10^{17}$ $cm^{-3}$, more preferably $20 \times 10^{17}$ $cm^{-3}$ to $80 \times 10^{17}$ $cm^{-3}$.

A thickness of the first intermediate layer 13 is preferably 20 nm to 150 nm. If the thickness is more than 150 nm, a surface of the first intermediate layer 13 may be roughened. If the thickness is less than 20 nm, it may be difficult to control a depth of the second groove 31 to be within the first intermediate layer 13 when forming the second grooves 31 to be described later. The thickness is more preferably 30 nm to 100 nm, and still more preferably 50 nm to 80 nm.

The second active layer 14 is a light-emitting layer of SQW or MQW structure provided on the first intermediate layer 13. An emission wavelength is green and is 510 nm to 550 nm. The second active layer 14 has a structure in which one to seven pairs of a barrier layer made of GaN and a well layer made of InGaN are alternately laminated. The number of pairs is more preferably 1 to 5, and further preferably 1 to 3. The number of pairs is preferably equal to or less than that of the first active layer 12, and more preferably less than that of the first active layer 12.

The second intermediate layer 15 is a semi-conductor layer provided on the second active layer 14, and is positioned between the second active layer 14 and the third active layer 16. The second intermediate layer 15 is provided for the same reason as that of the first intermediate layer 13, and is provided to enable light emission from the second active layer 14 and light emission from the third active layer 16 to be individually controlled. The second active layer 14 also serves to protect the second active layer 14 from etching damage when forming third grooves 32 to be described later.

A material of the second intermediate layer 15 is similar to that of the first intermediate layer 13. The first intermediate layer 13 and the second intermediate layer 15 may be made of the same material. The second intermediate layer 15 may also be doped with impurities similarly to the first intermediate layer 13. The first intermediate layer 13 and the second intermediate layer 15 may have the same thickness.

The third active layer 16 is a light-emitting layer of SQW or MQW structure provided on the second intermediate layer 15. An emission wavelength is red and is 590 nm to 700 nm. The third active layer 16 has a structure in which one to seven pairs of a barrier layer made of InGaN and a well layer made of InGaN are alternately laminated. The number of pairs is more preferably 1 to 5, and further preferably 1 to 3. The number of pairs is preferably equal to or less than that of the second active layer 14, and more preferably less than that of the second active layer 14.

The protective layer 17 is a semi-conductor layer provided on the third active layer 16. The protective layer 17 protects the active layer and also functions as an electron blocking layer. The protective layer 17 may be made of a material having a band gap wider than that of the well layer of the third active layer 16, such as AlGaN, GaN, or InGaN. A thickness of the protective layer 17 is preferably 2.5 nm to 50 nm, more preferably 5 nm to 25 nm. The protective layer 17 may be doped with impurities or Mg. In this case, an Mg concentration is preferably $1 \times 10^{18}$ $cm^{-3}$ to $1000 \times 10^{18}$ $cm^{-3}$.

Figure 2:
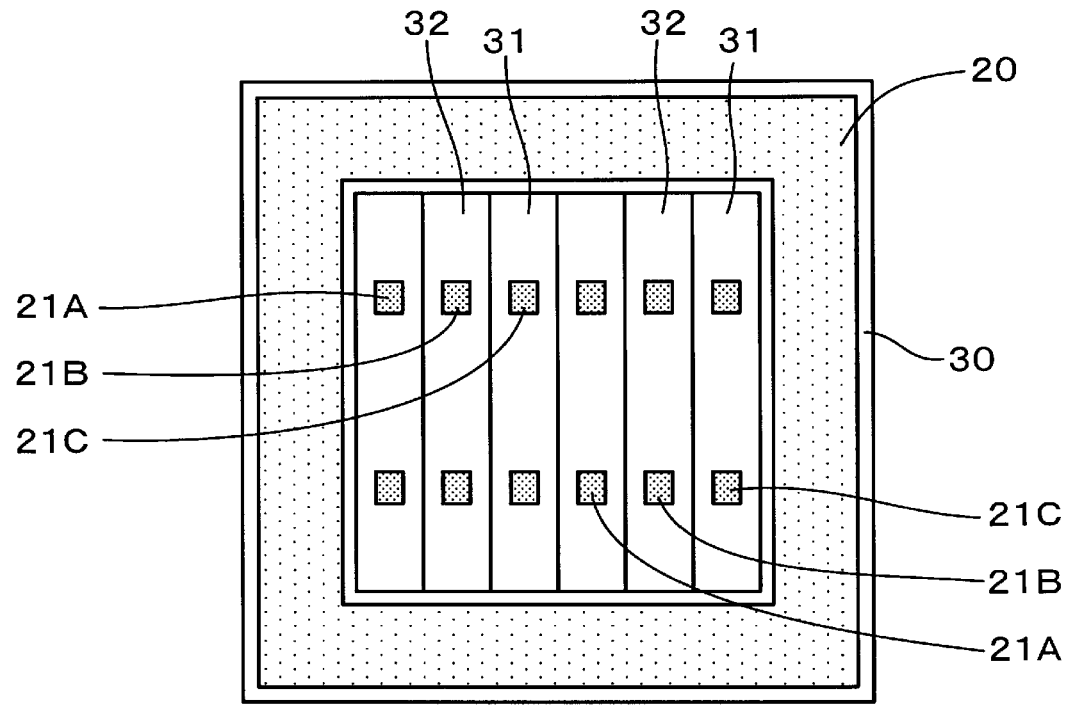
FIG. 2 is a diagram showing a plane pattern of grooves and electrodes.

A partial region of the protective layer 17 is etched to provide grooves, and the third grooves 32 reaching the second intermediate layer 15 from the protective layer 17, the second grooves 31 reaching the first intermediate layer 13, and a first groove 30 reaching the n-layer 11 are provided. A plane pattern of the first groove 30, the second groove 31, and the third groove 32 is as shown in FIG. 2. The first groove 30 is provided in an outer peripheral region of the LED display element in an annular pattern along an outer periphery of the LED display element. The second groove 31 and the third groove 32 are provided in a stripe pattern in which a region where no groove is provided, the third groove 32, the second groove 31, a region where no groove is provided, the third groove 32, and the second groove 31 are repeatedly provided in this order from one end of a region surrounded by the first groove 30. Therefore, in the LED display element of the first embodiment, the pixels are not divided by the grooves, and the semi-conductor layer is continuously provided.

The p-layer 18 is a semi-conductor layer continuously provided in a film shape on the protective layer 17, on the second intermediate layer 15 exposed at a bottom surface of the third groove 32, and on the first intermediate layer 13 exposed at a bottom surface of the second groove 31, and includes a first layer and a second layer in this order from the substrate 10. Hereinafter, in the p-layer 18, a region on the protective layer 17 is referred to as a p-layer 18A, a region on the second intermediate layer 15 is referred to as a p-layer 18B, and a region on the first intermediate layer 13 is referred to as a p-layer 18C. The first layer is preferably p-GaN or p-InGaN. A thickness of the first layer is preferably 10 nm to 500 nm, more preferably 10 nm to 200 nm, and still more preferably 10 nm to 100 nm. An Mg concentration of the first layer is preferably $1 \times 10^{19}$ $cm^{-3}$ to $100 \times 10^{19}$ $cm^{-3}$. The second layer is preferably p-GaN or p-InGaN. A thickness of the second layer is preferably 2 nm to 50 nm, more preferably 4 nm to 20 nm, and still more preferably 6 nm to 10 nm. An Mg concentration of the second layer is preferably $1 \times 10^{20}$ $cm^{-3}$ to $100 \times 10^{20}$ $cm^{-3}$.

In the first embodiment, the p-layer 18 is continuously provided on the protective layer 17, the second intermediate layer 15, and the first intermediate layer 13, but the p-layer 18 may be provided separately. A regrowth layer having the same configuration as the protective layer 17 or an electron blocking layer may be provided between the p-layer 18A and the protective layer 17, between the p-layer 18B and the second intermediate layer 15, and between the p-layer 18C and the first intermediate layer 13. The electron blocking layer blocks electrons from entering the p-layer 18 beyond the third active layer 16. The electron blocking layer may be a single layer of GaN or AlGaN, or may have a structure in which two or more of AlGaN, GaN, and InGaN are laminated, or a structure in which AlGaN or the like is laminated by changing only a composition ratio. Alternatively, the electron blocking layer may have a superlattice structure. A thickness of the electron blocking layer is, for example, 5 nm to 50 nm, and an Mg concentration is, for example, $1 \times 10^{19}$ $cm^{-3}$ to $100 \times 10^{19}$ $cm^{-3}$.

The n-electrode 20 is provided on the n-layer 11 exposed at a bottom surface of the first groove 30. As shown in FIG. 2, the n-electrode 20 has a rectangular annular pattern along the outer periphery of the LED display element. There is one n-electrode, which is common to the pixels and the sub-pixels. The n-electrode 20 has a structure with low reflectance (reflectance when light is incident on the n-electrode 20 from GaN, the same applies to the reflectance of the n-electrode 20 unless otherwise specified). A more detailed configuration and material of the n-electrode 20 will be described later.

The p-electrodes 21A to 21C are provided separately on the p-layers 18A to 18C, respectively. The p-electrodes 21A to 21C are provided as a set on a region to be a pixel, respectively. The p-electrodes 21A to 21C are respectively provided on regions to be sub-pixels. In each of the active layers, regions immediately below the p-electrodes 21A to 21C are to be light-emitting portions. Thus, a region of the third active layer 16 immediately below the p-electrode 21A (a region facing the p-electrode 21A) emits red light and is a red sub-pixel, a region of the second active layer 14 immediately below the p-electrode 21B (a region facing the p-electrode 21B) emits green light and is a green sub-pixel, and a region of the first active layer 12 immediately below the p-electrode 21C (a region facing the p-electrode 21C) emits blue light and is a blue sub-pixel. The p-electrodes 21A to 21C have a structure with low reflectance (reflectance when light is incident on the p-electrodes 21A to 21C from GaN, the same applies to the reflectance of the p-electrodes 21A to 21C unless otherwise specified). Detailed configurations and materials of the p-electrodes 21A to 21C will be described later.

3. Configuration of n-Electrode 20

Figure 3:
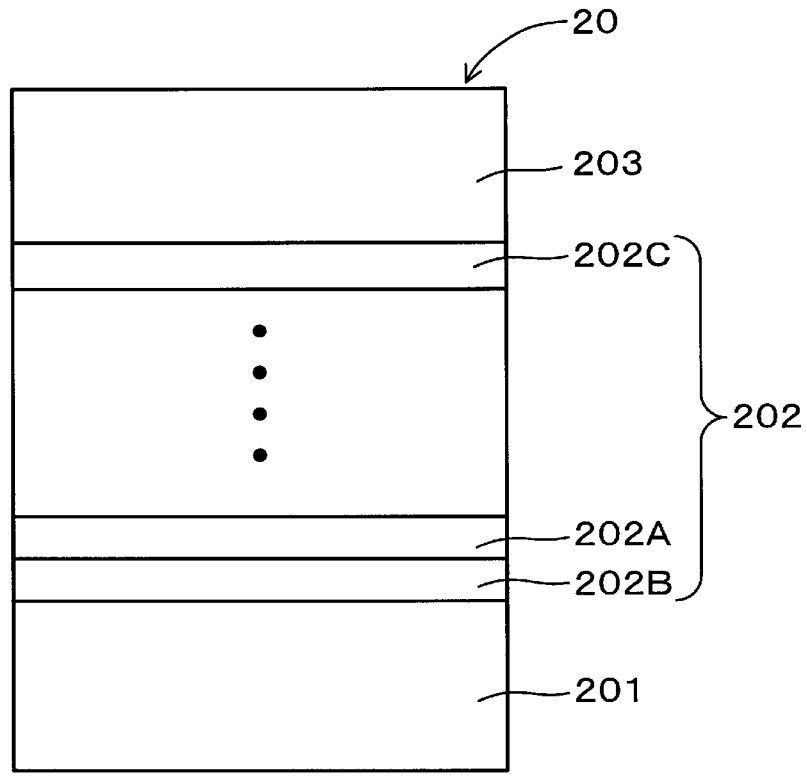
FIG. 3 is a diagram showing a configuration of an n-electrode 20.

Next, the configuration of the n-electrode 20 will be described in detail. FIG. 3 is a diagram showing the configuration of the n-electrode 20. As shown in FIG. 3, the n-electrode 20 includes an n-contact layer 201 provided in contact with the n-layer 11, an n-side low-reflection layer 202 provided on the n-contact layer 201, and an n-side joining layer 203 provided on the n-side low-reflection layer 202.

The n-contact layer 201 is provided to make ohmic contact with the n-layer 11 and reduce the contact resistance of the n-electrode 20 with respect to the n-layer 11. A material of the n-contact layer 201 is Ti, V, Cr, Ni, or the like.

The n-side low-reflection layer 202 is formed by alternately laminating two or more pairs of a light-transmitting metal film 202A and a transparent conductive film 202B. The number of pairs is preferably 2 to 6. The light-transmitting metal film 202A is a metal film having a thickness that allows light to pass through. The n-side low-reflection layer 202 reduces the reflectance of the n-electrode 20. Both the light-transmitting metal film 202A and the transparent conductive film 202B are made of a conductive material, and the entire n-side low-reflection layer 202 has conductivity.

The reason why the light reflectance of the n-electrode 20 is reduced by the n-side low-reflection layer 202 is as follows. First, in the n-side low-reflection layer 202, the reflection at an interface between the n-layer 11 and the n-contact layer 201, the reflection at an interface between the n-contact layer 201 and the n-side low-reflection layer 202, and the reflection at interfaces of the respective layers of the n-side low-reflection layer 202 are generally weakened. Second, each of the light-transmitting metal films 202A of the n-side low-reflection layer 202 absorbs light. Even if each of the light-transmitting metal films 202A has a small thickness, a total thickness is sufficient, so that light can be sufficiently absorbed.

Examples of a material of the light-transmitting metal film 202A include Cr, Ir, Mo, Ni, Pt, Rh, Ta, Ti, V, W, and TiN. Materials with high absorption and low reflectance with respect to visible light, particularly emission wavelength are preferable. The light-transmitting metal film 202A may be an alloy, for example, an alloy mainly containing the metal elements listed above. The plurality of light-transmitting metal films 202A may be made of the same material or different materials.

A material of the transparent conductive film 202B may be a transparent conductive oxide having high conductivity and high transmittance with respect to visible light, particularly emission wavelength. Examples thereof include ITO and IZO. The plurality of transparent conductive films 202B may be made of the same material or different materials.

A first layer (a layer closest to the n-contact layer 201) of the n-side low-reflection layer 202 is preferably the transparent conductive film 202B. The reflection of light at the interface between the n-contact layer 201 and the n-side low-reflection layer 202 is increased, and the reflection is canceled by the reflection at the interfaces of the respective layers of the n-side low-reflection layer 202, whereby the reflection of the n-electrode 20 can be further reduced. A last layer (an uppermost layer farthest from the n-layer 11) of the n-side low-reflection layer 202 may be either the light-transmitting metal film 202A or the transparent conductive film 202B.

To reduce the reflectance of the n-electrode 20, the thickness of the light-transmitting metal film 202A closest to the n-layer 11 may be smaller than the thickness of the transparent conductive film 202B closest to the n-layer 11. Similarly, a total thickness of the n-side low-reflection layer 202 may be larger than that of the n-contact layer 201.

The light-transmitting metal film 202A has a thickness that allows light to pass through (for example, a transmittance of 5% or more in a range of visible light). For example, the light-transmitting metal film 202A is 100 nm or less. This is because if the light-transmitting metal film 202A has a thickness that does not allow light to pass through, the light does not transmit to the n-side low-reflection layer 202 in the subsequent stage than the light-transmitting metal film 202A and the subsequent structure may not function. However, when the last layer (the layer farthest from then-layer 11) of the n-side low-reflection layer 202 is the light-transmitting metal film 202A, the light-transmitting metal film 202A of the last layer may use a light-impermeable metal film 202C and may have a thickness that does not allow light to pass through, for example, a thickness larger than 100 nm.

The thicknesses of the n-contact layer 201 and the respective layers of the n-side low-reflection layer 202 are preferably set such that an incident angle dependence and a wavelength dependence of the reflectance of the n-electrode 20 satisfy the following ranges. Regarding the wavelength dependence, a maximum reflectance is 5% or less, preferably 3% or less in the range of visible light (wavelength of 400 nm to 700 nm) at an incident angle of 0° (vertical incidence). Regarding the incident angle dependence, a maximum reflectance is 10% or less, and preferably 5% or less, in a range where the incident angle is 16° or less with respect to the light of the emission wavelength of the first active layer 12, the second active layer 14, and the third active layer 16. The thickness of the n-contact layer 201 may be fixed, and the thicknesses of the respective layers of the n-side low-reflection layer 202 may be set to satisfy the above condition.

The thicknesses of the n-contact layer 201 and the respective layers of the n-side low-reflection layer 202 are preferably set as follows. First, a plurality of combinations are set for the thicknesses of the n-contact layer 201 and the respective layers of the n-side low-reflection layer 202. Then, for the plurality of combinations, the reflectance of the n-electrode 20 is integrated within a wavelength range of 400 nm to 700 nm and an incident angle range of 0° to 16°. Next, a minimum integrated value is extracted from a plurality of obtained integrated values. Next, an integrated value equal to or less than twice the minimum integrated value is extracted from the plurality of obtained integrated values, and a combination of the thicknesses of the respective layers corresponding to the extracted integrated value is extracted. The combination of the thicknesses of the respective layers thus extracted is set as the thicknesses of the n-contact layer 201 and the respective layers of the n-side low-reflection layer 202. Although both the n-contact layer 201 and the n-side low-reflection layer 202 are considered in the above description, the thickness of the n-contact layer 201 may be fixed and only the n-side low-reflection layer 202 may be considered.

The n-side joining layer 203 is a layer that connects to the outside of the element. A material of the n-side joining layer 203 is Au or an Au alloy mainly containing Au.

The n-side low-reflection layer 202 may be provided directly on the n-layer 11 without the n-contact layer 201. In this case, the first layer (the layer in contact with the n-layer 11) in the n-side low-reflection layer 202 is preferably the light-transmitting metal film 202A. In this case, the first layer of the light-transmitting metal film 202A may be made of the same material as the n-contact layer 201. A barrier layer or the like for preventing diffusion of metal may be inserted between the n-contact layer 201 and the n-side low-reflection layer 202 or between the n-side low-reflection layer 202 and the n-side joining layer 203.

4. Configuration of p-Electrodes 21A to 21C

Figure 4:
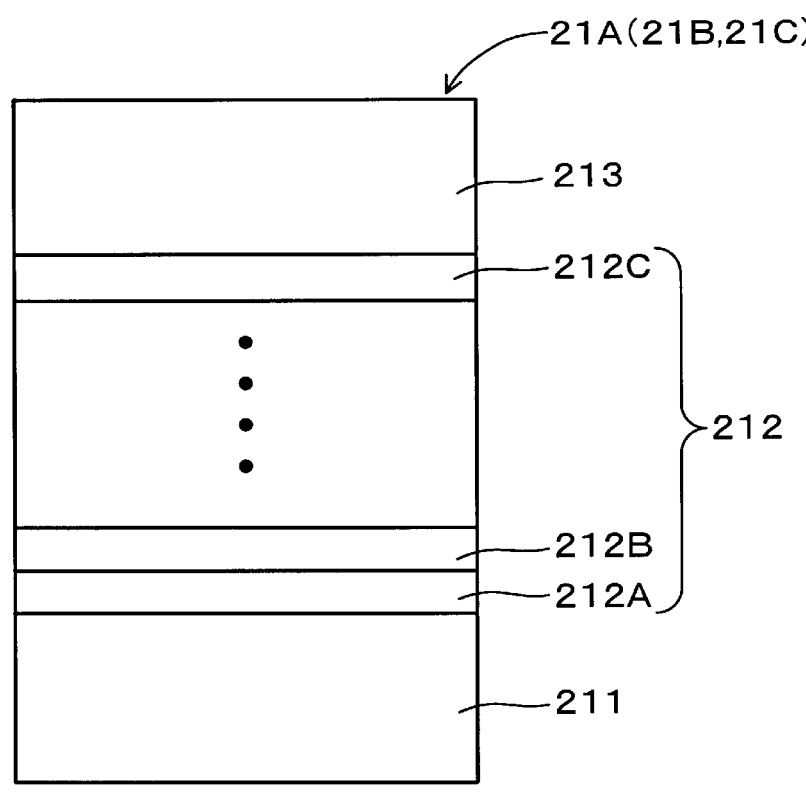
FIG. 4 is a diagram showing a configuration of p-electrodes 21A to 21C.

Next, a configuration of the p-electrodes 21A to 21C will be described in detail. FIG. 4 is a diagram showing the configuration of the p-electrodes 21A to 21C. As shown in FIG. 4, the p-electrodes 21A to 21C include a p-contact layer 211 provided in contact with the p-layers 18A to 18C, a p-side low-reflection layer 212 provided on the p-contact layer, and a p-side joining layer 213 provided on the p-side low-reflection layer 212.

The p-contact layer 211 is provided to make ohmic contact with the p-layers 18A to 18C and reduce the contact resistance of the p-electrodes 21A to 21C with respect to the p-layers 18A to 18C. A material of the p-contact layer 211 is ITO, IZO, Ni/Au, Co/Au, Ru/Au, Ni, Co, Ru, or the like. Here, "/" means lamination, and "A/B" means a structure in which A and B are laminated in this order.

The p-side low-reflection layer 212 is formed by alternately laminating two or more pairs of a light-transmitting metal film 212A and a transparent conductive film 212B. The number of pairs is preferably 3 to 6. The light-transmitting metal film 212A is a metal film having a thickness that allows light to pass through. The p-side low-reflection layer 212 reduces the reflectance of the p-electrodes 21A to 21C. Both the light-transmitting metal film 212A and the transparent conductive film 212B are made of a conductive material, and the entire p-side low-reflection layer 212 has conductivity. The p-side low-reflection layer 212 and the n-side low-reflection layer 202 may have the same structure.

The reason why the light reflectance of the p-electrodes 21A to 21C is reduced by the p-side low-reflection layer 212 is the same as that of the n-side low-reflection layer 202.

A material of the light-transmitting metal film 212A and a material of the transparent conductive film 212B are the same as those of the n-side low-reflection layer 202. In the case where a last layer (an uppermost layer and a layer farthest from then-layer 11 side) of the p-side low-reflection layer 212 is the light-transmitting metal film 212A, the light-transmitting metal film 212A of the last layer may use a light-impermeable metal film 212C and may have a thickness that does not transmit light, for example, larger than 100 nm.

When a transparent conductive film such as ITO or IZO is used as the p-contact layer 211, a first layer (a layer closest to the p-contact layer 211) of the p-side low-reflection layer 212 is preferably the light-transmitting metal film 212A. The reflection of light at an interface between the p-contact layer 211 and the p-side low-reflection layer 212 is increased, and the reflection is canceled by the reflection at interfaces of the respective layers of the p-side low-reflection layer 212, whereby the reflection of the p-electrodes 21A to 21C can be further reduced. The last layer (the uppermost layer) of the p-side low-reflection layer 212 may be either the light-transmitting metal film 212A or the transparent conductive film 212B.

Thicknesses of the p-contact layer 211 and the respective layers of the p-side low-reflection layer 212 are the same as those of the n-contact layer 201 and the n-side low-reflection layer 202. However, since the p-layer 18 is more difficult to form a contact as compared with the n-layer 11, the thickness of the p-contact layer 211 may be fixed to a thickness at which the contact can be formed, and the thicknesses of the respective layers of the p-side low-reflection layer 212 may be set such that the incident angle dependence and the wavelength dependence of the reflectance of the p-electrodes 21A to 21C satisfy the same conditions as those of the n-electrode 20.

Thus, the thicknesses of the respective layers of the p-side low-reflection layer 212 may be set as follows. First, a plurality of combinations are set for the thicknesses of the respective layers of the p-side low-reflection layer 212. Then, for the plurality of combinations, the reflectance of the p-electrodes 21A to 21C is integrated within a wavelength range of 400 nm to 700 nm and an incident angle range of $0°$ to $16°$. Next, a minimum integrated value is extracted from a plurality of obtained integrated values. Next, an integrated value equal to or less than twice the minimum integrated value is extracted from the plurality of obtained integrated values, and a combination of the thicknesses of the respective layers corresponding to the extracted integrated value is extracted. The combination of the thicknesses of the respective layers thus extracted is set as the thicknesses of the respective layers of the p-side low-reflection layer 212.

To reduce the reflectance of the p-electrodes 21A to 21C, the thickness of the light-transmitting metal film 212A closest to the p-layer 18 may be smaller than the thickness of the transparent conductive film 212B closest to the p-layer 18. Similarly, a total thickness of the p-side low-reflection layer 212 may be larger than that of the p-contact layer 211.

To reduce the reflectance of the p-electrodes 21A to 21C, the thickness of the light-transmitting metal film 212A closest to the n-layer 11 may be smaller than the thickness of the transparent conductive film 212B closest to the n-layer 11. Similarly, the total thickness of the p-side low-reflection layer 212 may be larger than that of the p-contact layer 211.

The p-side joining layer 213 is similar to the n-side joining layer 203 and is connected to the outside of the element.

A barrier layer or the like for preventing diffusion of metal may be inserted between the p-contact layer 211 and the p-side low-reflection layer 212 or between the p-side low-reflection layer 212 and the p-side joining layer 213.

5. Operation of LED Display Element

Next, an operation of the LED display element of the first embodiment will be described. In the LED display element of the first embodiment, by applying a voltage between the p-electrode 21A and the n-electrode 20 of one pixel, red light can be emitted from a region of the third active layer 16 immediately below the p-electrode 21A, by applying a voltage between the p-electrode 21B and the n-electrode 20 of one pixel, green light can be emitted from a region of the second active layer 14 immediately below the p-electrode 21B, and by applying a voltage between the p-electrode 21C and the n-electrode 20 of one pixel, blue light can be emitted from a region of the first active layer 12 immediately below the p-electrode 21C. Emission of the colors can be controlled independently, and two or more of blue, green, and red light can be emitted simultaneously. As described above, in the LED display element of the embodiment, blue, green and red light emission of a desired pixel (i.e., light emission of each of the sub-pixels) can be controlled by selecting an electrode to which a voltage is applied, and the LED display element can be used as a full-color display.

Here, a part of the light emitted from one sub-pixel is directed to the p-electrodes 21A to 21C or the n-electrode 20 either directly or after being reflected inside the element. The external light incident from the outside of the element to the inside of the element may be directed to the p-electrodes 21A to 21C or the n-electrode 20. In the case of the p-electrodes 21A to 21C and the n-electrode 20 in the conventional art which do not use a low-reflection layer, the reflectance is about 30%, a part of the light is reflected by the p-electrodes 21A to 21C and the n-electrode 20, and there is light directed to a region that is not emitting light. Therefore, a pixel that is not emitting light may appear to emit light or may be not dark enough.

On the other hand, in the LED display element of the first embodiment, the n-side low-reflection layer 202 and the p-side low-reflection layer 212 are provided on the n-electrode 20 and the p-electrodes 21A to 21C, resulting in a structure with extremely low reflectance. Therefore, the reflection of light by the n-electrode 20 and the p-electrodes 21A to 21C is reduced, and the above problem is alleviated. Since the reflectance of the n-electrode 20 and the p-electrodes 21A to 21C is low and constant over the entire wavelength range of visible light, emission colors are not affected. As a result, in the LED display element of the first embodiment, the contrast of the display can be improved, and the region not emitting light can be prevented from appearing to emit light.

As described above, in the LED display element of the first embodiment, since the reflectance of the n-electrode 20 and the p-electrodes 21A to 21C is low, the reflection of light by the n-electrode 20 and the p-electrodes 21A to 21C is reduced. As a result, according to the LED display element of the first embodiment, the contrast of the display can be improved.

6. Method of Manufacturing LED Display Element

Next, a manufacturing process of the LED display element of the first embodiment will be described with reference to the drawings.

Figure 5:
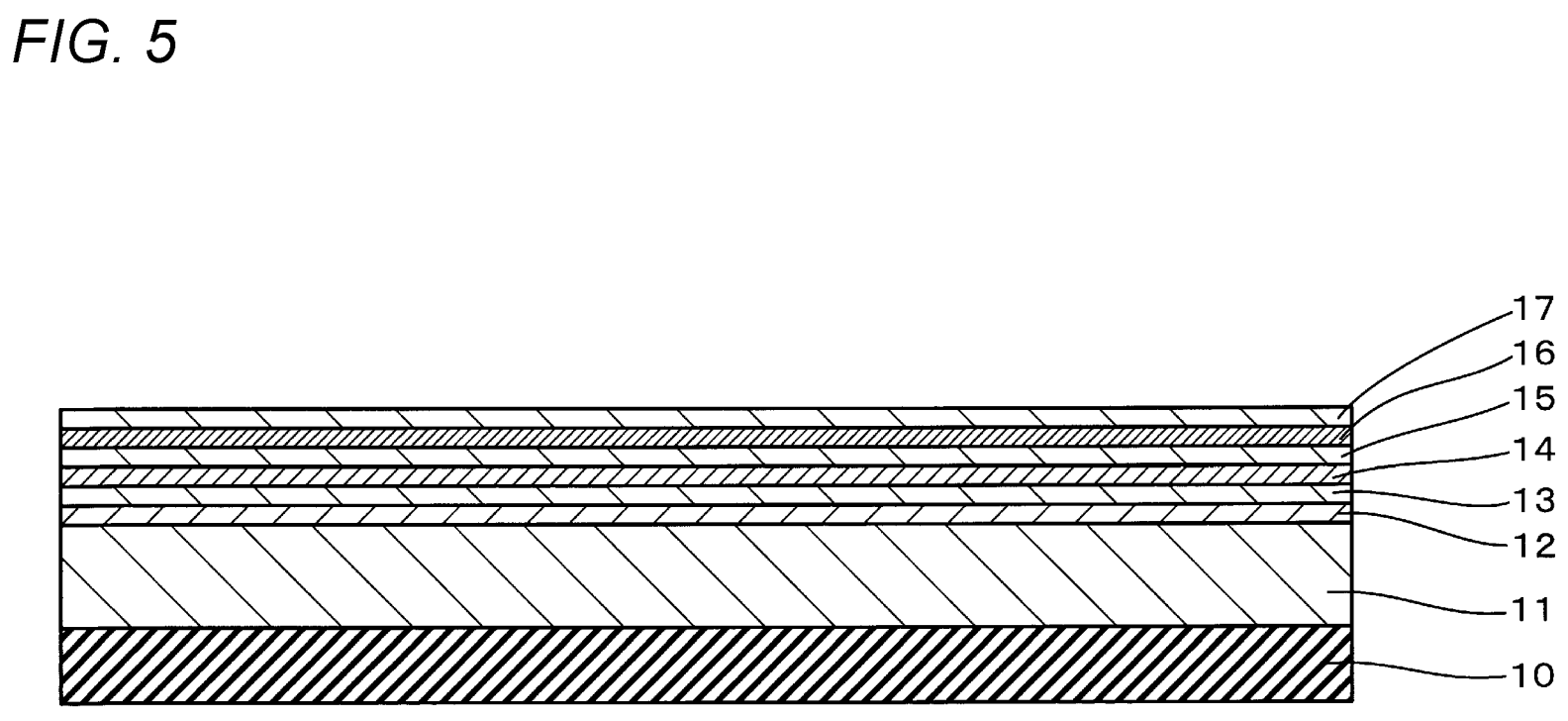

First, the n-layer 11, the first active layer 12, the first intermediate layer 13, the second active layer 14, the second intermediate layer 15, the third active layer 16, and the protective layer 17 are sequentially formed on the substrate 10 (see FIG. 5).

Figure 6:
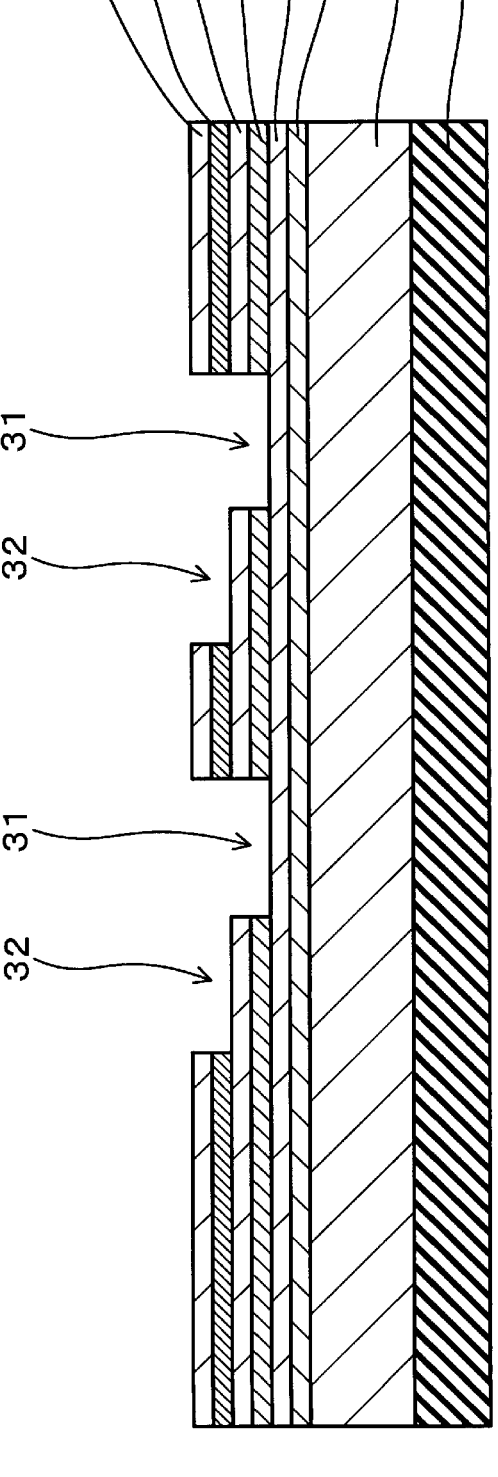
FIG. 6 is a diagram showing a manufacturing process of the LED display element of the first embodiment.

Next, part of a surface of the protective layer 17 is dry-etched until reaching the second intermediate layer 15 to form the third groove 32, and is dry-etched until reaching the first intermediate layer 13 to form the second groove 31 (see FIG. 6). The third groove 32 and the second groove 31 are preferably etched to intermediate thicknesses of the second intermediate layer 15 and the first intermediate layer 13.

Figure 7:
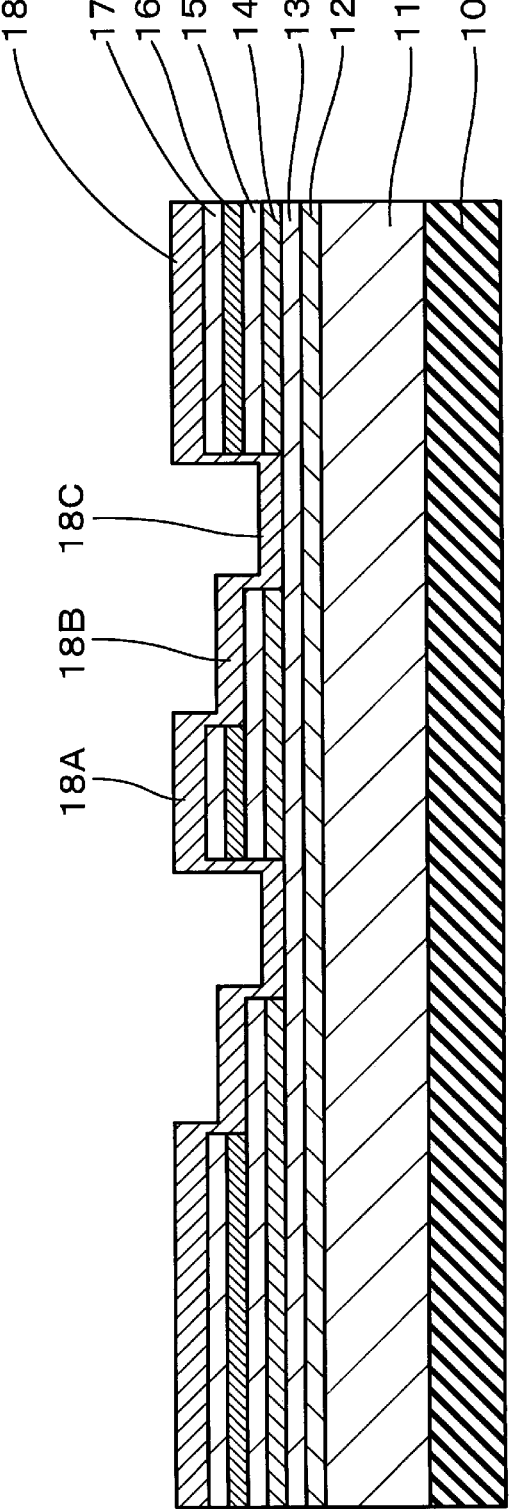
FIG. 7 is a diagram showing a manufacturing process of the LED display element of the first embodiment.

Next, the p-layers 18A to 18C are formed on the protective layer 17, on the second intermediate layer 15 exposed by the third groove 32, and on the first intermediate layer 13 exposed by the second groove 31 (see FIG. 7. The p-layers 18A to 18C may be continuous or separated.

Figure 8:
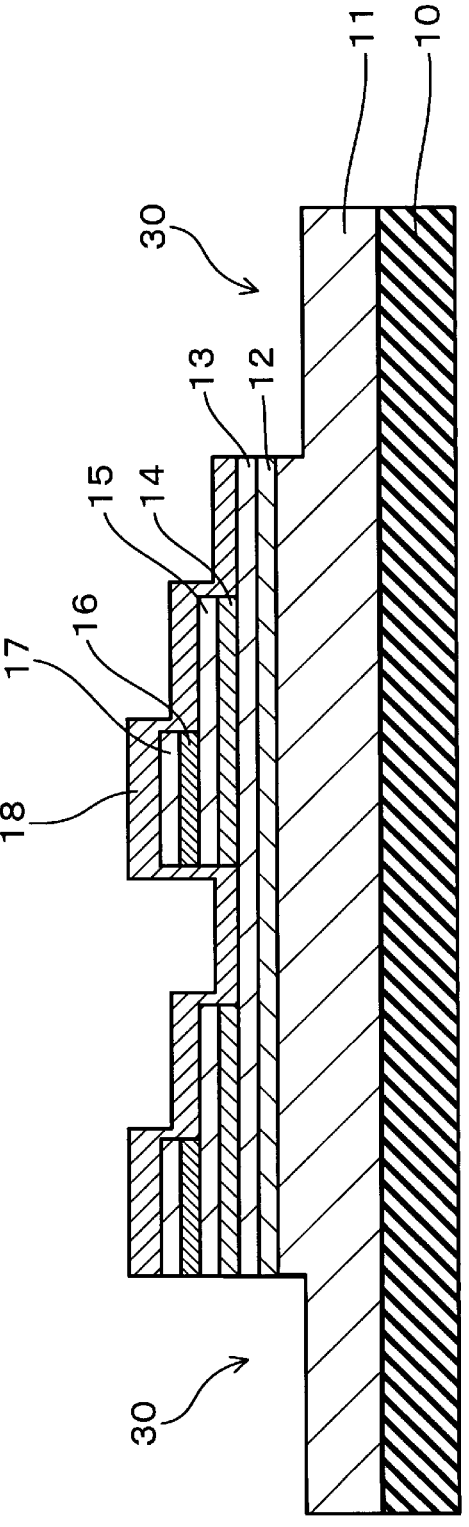
FIG. 8 is a diagram showing a manufacturing process of the LED display element of the first embodiment.

Next, part of a surface of the p-layer 18C is dry-etched until reaching the n-layer 11 to form the first groove 30 (see FIG. 8). Then, the n-electrode 20 is formed on the n-layer 11 exposed at the bottom surface of the first groove 30, and the p-electrodes 21A to 21C are formed on the p-layers 18A to 18C. Thus, the LED display element of the first embodiment is manufactured. Either the n-electrode 20 or the p-electrodes 21A to 21C may be formed first.

In the formation of the n-electrode 20 and the p-electrodes 21A to 21C, sputtering or vapor deposition is used for film formation, and lift-off is used for pattern formation. Sputtering is preferable for film formation. The respective layers of the n-electrode 20 and the p-electrodes 21A to 21C can be formed flat without unevenness, and the transparency of the transparent conductive films 202B and 212B can be improved.

In general, it is difficult for the p-layers 18A to 18C to form a contact with an electrode as compared with the n-layer 11. Therefore, when forming the p-electrodes 21A to 21C, the p-contact layer 211 is formed on the p-layers 18A to 18C, and then annealing is performed to lower the contact resistance with the p-layers 18A to 18C, and thereafter, the p-side low-reflection layer 212 and the p-side joining layer 213 may be laminated in this order. At this time, a width of the p-side low-reflection layer 212 may be smaller than a width of the p-contact layer 211 so that the p-side low-reflection layer 212 can be formed on the p-contact layer 211 even if positional deviation or dimensional deviation occurs. On the other hand, the n-electrode 20 may not be annealed after the n-contact layer 201 is formed and before the n-side low-reflection layer 202 is formed.

If the n-side low-reflection layer 202 and the n-side joining layer 203 have the same structure as the p-side low-reflection layer 212 and the p-side joining layer 213, these layers can be simultaneously formed in the same process. Part of the n-side low-reflection layer 202 and the p-side low-reflection layer 212 may have the same structure and may be formed simultaneously.

For example, the n-side low-reflection layer 202 and the p-side low-reflection layer 212 may have the same structure in which the light-transmitting metal films 202A and 212A are the first layers, and may be simultaneously formed as follows by omitting the n-contact layer 201 from the n-electrode 20. First, the p-contact layer 211 is formed on the p-layers 18A to 18C and then annealed. Next, the n-side low-reflection layer 202 and the n-side joining layer 203, the p-side low-reflection layer 212 and the p-side joining layer 213 are simultaneously formed on the n-layer 11 and the p-contact layer 211, respectively.

EXPERIMENTAL EXAMPLES

Experimental Example 1

Next, simulation results about the n-electrode 20 of the first embodiment will be described.

Experimental Example 1-1

With respect to the n-electrode 20 in which the n-contact layer 201, the n-side low-reflection layer 202, and the n-side joining layer 203 were laminated in this order on a GaN layer, the reflectance of light incident on the n-electrode 20 from the GaN layer was calculated by simulation. The n-contact layer 201 was made of Ti, and the n-side low-reflection layer 202 had a structure in which three pairs of ITO and Ti layers were alternately laminated in which the first layer was made of ITO. The n-side joining layer 203 was made of Au and had an infinite thickness. Then, the reflectance of the n-electrode 20 was integrated by the wavelength (a range of 400 nm to 700 nm) and the incident angle (a range of 0° to 16°), and the thicknesses of the n-contact layer 201 and the respective layers of the n-side low-reflection layer 202 were set such that the integrated value is minimized.

Figures 9A, 9B:
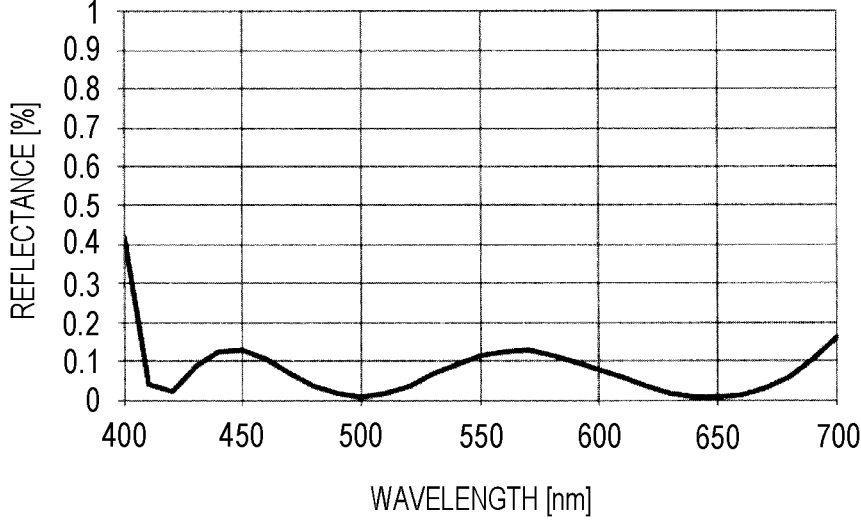
FIG. 9A is a table of thicknesses of respective layers of the n-electrode 20.
FIG. 9B is a graph showing the wavelength dependence of the reflectance.

FIG. 9A is a table of the thicknesses of the respective layers of the n-electrode 20, and FIG. 9B is a graph showing the wavelength dependence of the reflectance of the n-electrode 20. The wavelength dependence of the reflectance is when the incident angle is 0°. As shown in the graph of FIG. 9B, the reflectance was 1% or less in the visible light region of the wavelength of 400 nm to 700 nm. In the incident angle range of 0° to 16°, the reflectance was 1% or less in the visible light region.

Experimental Example 1-2

Simulation was performed in the same manner by replacing the structure in Experimental Example 1-1 with a structure in which the n-contact layer 201 was made of Ti, and the n-side low-reflection layer 202 had a structure in which three pairs of ITO and W layers were alternately laminated in which the first layer was made of ITO. The thicknesses of the n-contact layer 201 and the respective layers of the n-side low-reflection layer 202 were set in the same manner as in Experimental Example 1-1.

Figures 10A, 10B:
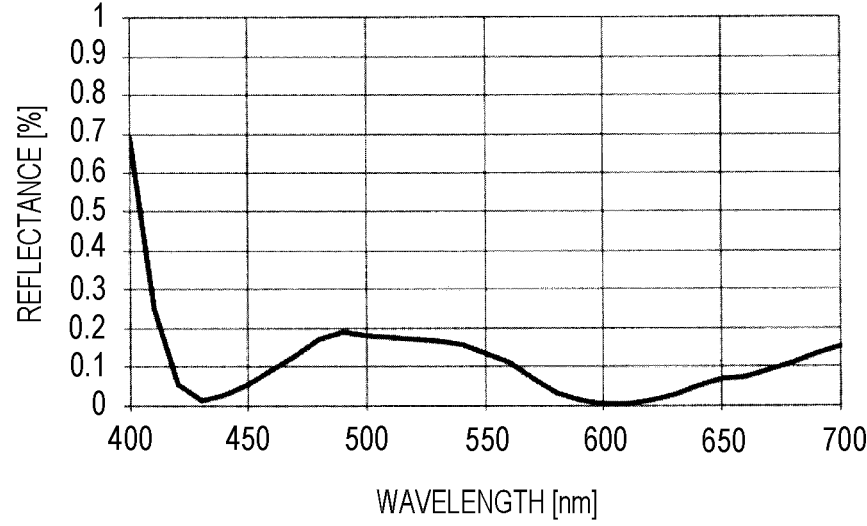
FIG. 10A is a table of thicknesses of respective layers of the n-electrode 20.
FIG. 10B is a graph showing the wavelength dependence of the reflectance.

FIG. 10A is a table of the thicknesses of the respective layers of the n-electrode 20, and FIG. 10B is a graph showing the wavelength dependence of the reflectance of the n-electrode 20. The wavelength dependence of the reflectance is when the incident angle is 0°. As shown in the graph of FIG. 10B, the reflectance was 1% or less in the visible light region of the wavelength of 400 nm to 700 nm. In the incident angle range of 0° to 16°, the reflectance was 1% or less in the visible light region.

Experimental Example 1-3

Simulation was performed in the same manner as in Experimental Example 1-1 by replacing the structure in Experimental Example 1-1 with a structure in which the n-contact layer 201 was made of V. and the n-side low-reflection layer 202 had a structure in which two pairs of ITO and Ta layers were alternately laminated in which the first layer was made of ITO. The thicknesses of the n-contact layer 201 and the respective layers of the n-side low-reflection layer 202 were set in the same manner as in Experimental Example 1-1.

Figures 11A, 11B:
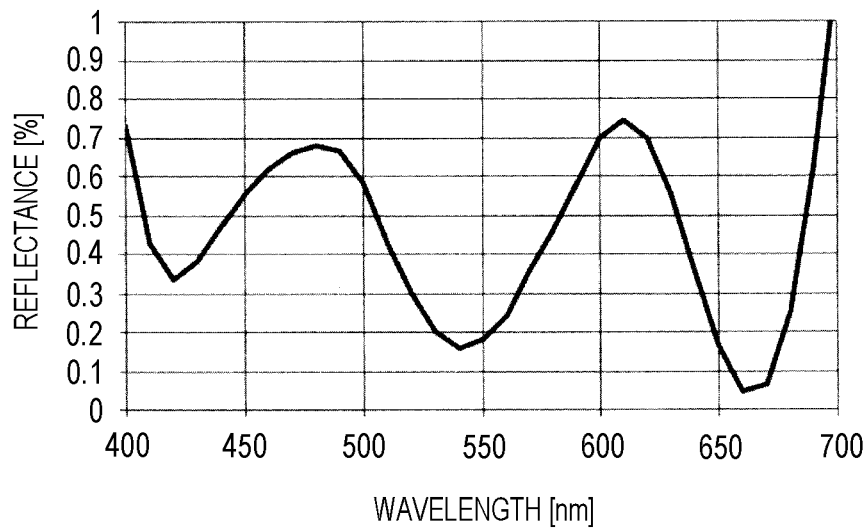
FIG. 11A is a table of thicknesses of respective layers of the n-electrode 20.
FIG. 11B is a graph showing the wavelength dependence of the reflectance.

FIG. 11A is a table of the thicknesses of the respective layers of the n-electrode 20, and FIG. 11B is a graph showing the wavelength dependence of the reflectance of the n-electrode 20. The wavelength dependence of the reflectance is when the incident angle is 0°. As shown in the graph of FIG. 11B, in the visible light region of the wavelength of 400 nm to 700 nm, the reflectance was 1% or less except for a region very close to 700 nm. In the incident angle range of 0° to 16°, the reflectance was 1% or less except for the region very close to 700 nm in the visible light region.

Experimental Example 1-4

An uppermost layer (Ta layer) of the n-side low-reflection layer 202 in Experimental Example 1-3 was changed from 396.6 nm to 100 nm. The thicknesses of the other layers are not changed from the table of FIG. 11A. In this case, the reflectance was calculated.

Figures 12A, 12B:
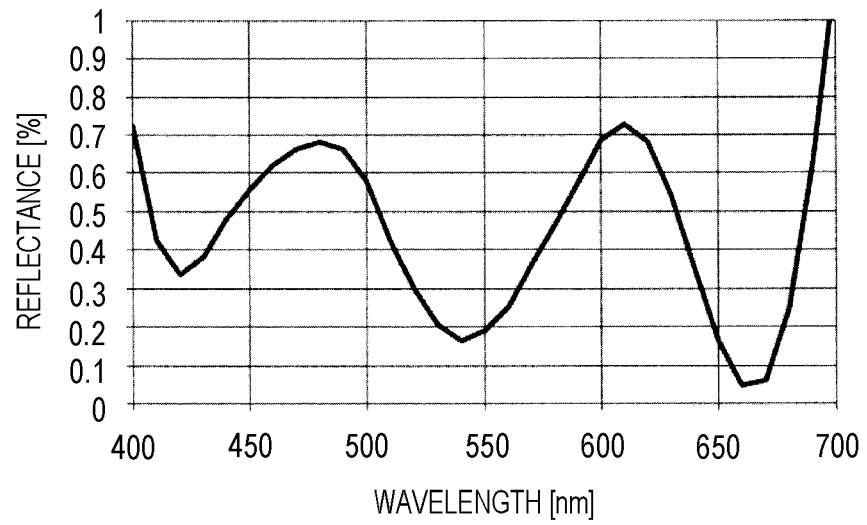
FIG. 12A is a table of thicknesses of respective layers of the n-electrode 20.
FIG. 12B is a graph showing the wavelength dependence of the reflectance.

FIG. 12A is a table of the thicknesses of the respective layers of the n-electrode 20, and FIG. 12B is a graph showing the wavelength dependence of the reflectance of the n-electrode 20. The wavelength dependence of the reflectance is when the incident angle is 0°. As shown in FIG. 12B, there was no change in the reflectance as compared with FIG. 11B. It is considered that even when Ta was set to 100 nm, the Ta layer was sufficiently thick and does not transmit light, so that the reflectance was not affected.

Experimental Example 2

Next, simulation results about the p-electrodes 21A to 21C of the first embodiment will be described.

Experimental Example 2-1

With respect to the p-electrodes 21A to 21C in which the p-contact layer 211, the p-side low-reflection layer 212, the barrier layer, and the p-side joining layer 213 were laminated in this order on a GaN layer, the reflectance when light was incident from the GaN layer was calculated by simulation. The p-contact layer 211 was made of ITO and had a thickness of 100 nm, and the p-side low-reflection layer 212 had a structure in which 4.5 pairs of Ti and ITO layers were alternately laminated in which the first layer and the last layer were made of Ti. The barrier layer was made of Pt and had a thickness of 100 nm. The n-side joining layer 203 was made of Au and had an infinite thickness. Then, the reflectance of the p-electrodes 21A to 21C was integrated by the wavelength (a range of 400 nm to 700 nm) and the incident angle (a range of 0° to 16°), and the thicknesses of the respective layers of the p-side low-reflection layer 212 were set such that the integrated value is minimized. However, the thickness of the last layer (Ti) of the p-side low-reflection layer 212 was fixed to 100 nm.

Figures 13A, 13B:
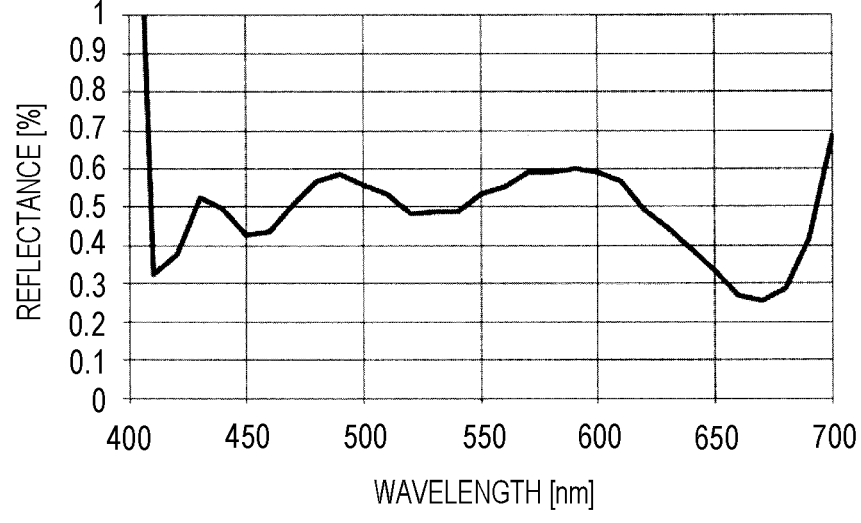
FIG. 13A is a table of thicknesses of respective layers of the p-electrodes 21A to 21C.
FIG. 13B is a graph showing the wavelength dependence of the reflectance.

FIG. 13A is a table of the thicknesses of the respective layers of the p-electrodes 21A to 21C, and FIG. 13B is a graph showing the wavelength dependence of the reflectance of the p-electrodes 21A to 21C. The wavelength dependence of the reflectance is when the incident angle is 0°. As shown in the graph of FIG. 13B, in the visible light region of the wavelength of 400 nm to 7M) nm, the reflectance was 1% or less except for a region very close to 400 nm, and the reflectance was 1% or less in almost the entire region. In the incident angle range of 0° to 16°, the reflectance was 1% or less in almost the entire visible light region.

Experimental Example 2-2

Simulation was performed in the same manner as in Experimental Example 2-1 except that the barrier layer was omitted and the p-side low-reflection layer 212 was changed from 4.5 pairs to 3.5 pairs. However, the thickness of the last layer (Ti) of the p-side low-reflection layer 212 was not fixed and was used as a parameter. The thicknesses of the respective layers of the p-side low-reflection layer 212 were set in the same manner as in Experimental Example 2-1.

Figures 14A, 14B:
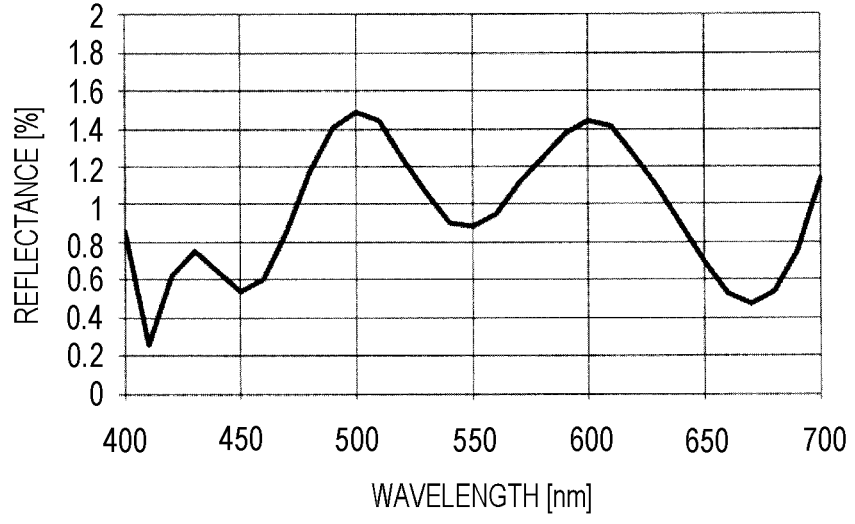
FIG. 14A is a table of thicknesses of respective layers of the p-electrodes 21A to 21C.
FIG. 14B is a graph showing the wavelength dependence of the reflectance.

FIG. 14A is a table of the thicknesses of the respective layers of the p-electrodes 21A to 21C, and FIG. 14B is a graph showing the wavelength dependence of the reflectance of the p-electrodes 21A to 21C. The wavelength dependence of the reflectance is when the incident angle is 0°. As shown in the graph of FIG. 14B, the reflectance was 2% or less in the visible light region of the wavelength of 400 nm to 700 nm. In the incident angle range of 0° to 16°, the reflectance was 2% or less except for the region very close to 700 nm in the visible light region.

Experimental Example 2-3

Simulation was performed in the same manner as in Experimental Example 2-1 by changing the p-side low-reflection layer 212 in Experimental Example 2-1 to a structure in which four pairs of Cr and ITO layers were alternately laminated and finally, a Ti layer was laminated. As in Experimental Example 2-1, the thickness of the last layer (Ti) of the p-side low-reflection layer 212 was fixed to 100 nm. The thicknesses of the respective layers of the p-side low-reflection layer 212 were set in the same manner as in Experimental Example 2-1.

Figures 15A, 15B:
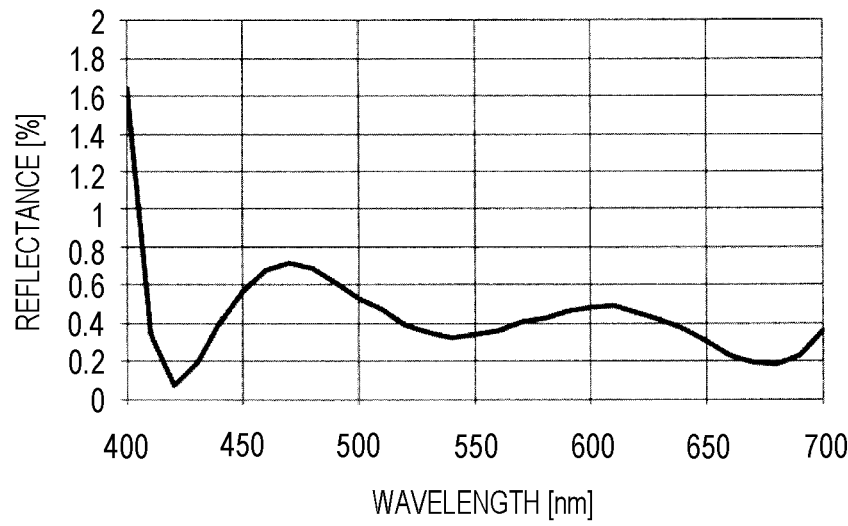
FIG. 15A is a table of thicknesses of respective layers of the p-electrodes 21A to 21C.
FIG. 15B is a graph showing the wavelength dependence of the reflectance.

FIG. 15A is a table of the thicknesses of the respective layers of the p-electrodes 21A to 21C, and FIG. 15B is a graph showing the wavelength dependence of the reflectance of the p-electrodes 21A to 21C. The wavelength dependence of the reflectance is when the incident angle is 0°. As shown in the graph of FIG. 15B, the reflectance was 2% or less in the visible light region of the wavelength of 400 nm to 700 nm. In the incident angle range of 0° to 16°, the reflectance was 2% or less in the visible light region.

Experimental Example 2-4

In Experimental Example 2-3, among the p-electrodes 21A to 21C, the ninth layer (ITO), the tenth layer (Ti), and the eleventh layer (Pt) counted from the p-contact layer 211 were omitted. The thicknesses of the other layers are not changed from the table of FIG. 15A. In this case, the reflectance was calculated in the same manner as in Experimental Example 2-1.

Figures 16A, 16B:
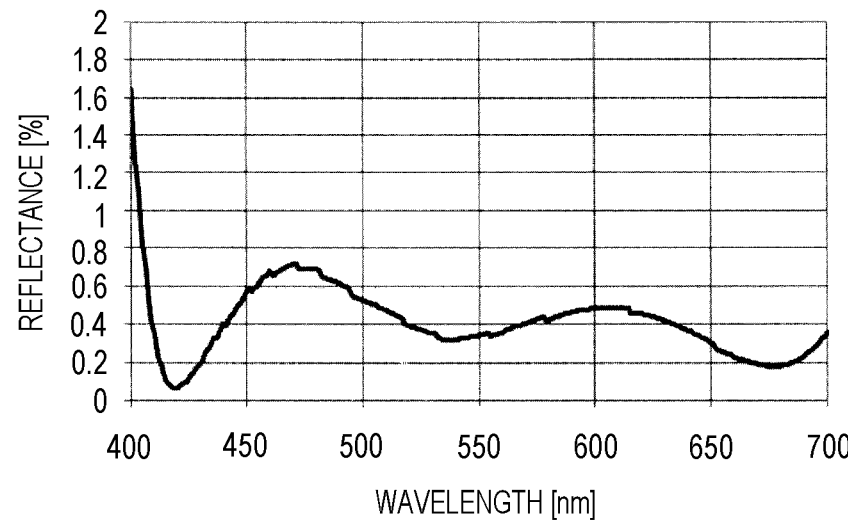
FIG. 16A is a table of thicknesses of respective layers of the p-electrodes 21A to 21C.
FIG. 16B is a graph showing the wavelength dependence of the reflectance.

FIG. 16A is a table of the thicknesses of the respective layers of the p-electrodes 21A to 21C, and FIG. 16B is a graph showing the wavelength dependence of the reflectance of the p-electrodes 21A to 21C. The wavelength dependence of the reflectance is when the incident angle is 0°. As shown in the graph of FIG. 16B, there was no change in the reflectance with respect to FIG. 15B. Among the p-electrodes 21A to 21C, the eighth layer (Cr) counted from the p-contact layer 211 is as thick as 177.7 nm, and light does not transmit to the subsequent layers. Therefore, it is considered that even if the ninth to eleventh layers are omitted, the reflectance was not affected.

As a result of Experimental Examples 1 and 2, it was found that by providing the n-side low-reflection layer 202 and the p-side low-reflection layer 212 in the n-electrode 20 and the p-electrodes 21A to 21C, the reflectance of the n-electrode 20 and the p-electrodes 21A to 21C can be significantly reduced. As a result of setting the thicknesses of the respective layers of the n-side low-reflection layer 202 and the p-side low-reflection layer 212, it was found that when the light-transmitting metal films 202A and 212A are thick enough not to transmit light, the reflectance is not affected even if the light-transmitting metal films 202A and 212A are thinned to such an extent that light does not pass through. As a result of setting the thicknesses of the respective layers of the n-side low-reflection layer 202 and the p-side low-reflection layer 212, it was found that when the light-transmitting metal films 202A and 212A in the middle are thick enough not to transmit light, the reflectance is not affected even if the subsequent layers are omitted.

MODIFICATION

The LED display element of the first embodiment is a full-color display in which a set of sub-pixels of blue, green, and red constitutes one pixel, but it can also be applied to a single-color or two-color display. In the LED display element of the first embodiment, three sub-pixels directly emit light of respective colors, but any other method may be used to achieve full color. For example, a method of wavelength conversion using a phosphor or the like may be employed. Specifically, blue and green may be emitted by a micro-LED, and red may be converted in wavelength from blue by a phosphor. Alternatively, a micro-LED that emits ultraviolet rays may be used to convert ultraviolet rays into blue light, green light, and red light.

In the LED display element of the first embodiment, no groove is provided between the pixels or between the sub-pixels for miniaturization and manufacturing cost reduction, but grooves may be provided. However, the LED display element of the first embodiment is suitable for a structure in which the pixels and the sub-pixels are not separated by grooves. In the case of the structure that is not separated by grooves, since the side surface of the active layer is not exposed, it is difficult to cover the side surface with an absorption film to increase the contrast. Therefore, a decrease in contrast becomes more pronounced due to crosstalk or the like. Even in such a case, the contrast can be increased by reducing the reflectance of the n-electrode 20 and the p-electrodes 21A to 21C as in the first embodiment.

In the LED display element of the first embodiment, the low-reflection layers (the n-side low-reflection layer 202 and the p-side low-reflection layer 212) are provided on both the n-electrode 20 and the p-electrodes 21A to 21C, but the low-reflection layer may be provided on only one of the n-electrode 20 and the p-electrodes 21A to 21C. However, it is preferable to provide the low-reflection layers on both the n-electrode 20 and the p-electrodes 21A to 21C as in the first embodiment to improve the contrast.

In the first embodiment, the group III nitride semiconductor is used as the semiconductor material, but the present invention can also be applied when other semiconductor materials are used.

REFERENCE SIGNS LIST

10: substrate
11: n-layer
12: first active layer
13: first intermediate layer
14: second active layer
15: second intermediate layer
16: third active layer
17: protective layer
18: p-layer
20: n-electrode
21A to 21C: p-electrode
201: n-contact layer
202: n-side low-reflection layer
202A, 212A: light-transmitting metal film
202B, 212B: transparent conductive film
203: n-side joining layer
211: p-contact layer
212: p-side low-reflection layer
213: p-side joining layer
What is claimed is:
1. A monolithic type LED display element comprising:
an n-layer;
an active layer;
a p-layer;
an n-electrode; and
p-electrodes, wherein regions of the active layer facing the p-electrodes serve as light-emitting portions, at least one of the p-electrodes or the n-electrode includes a low-reflection layer in which a transparent conductive film containing a transparent conductive oxide and a light-transmitting metal film capable of transmitting light are alternately laminated, and wherein the low-reflection layer, as a whole, has conductivity.

2. The LED display element according to claim 1, wherein the low-reflection layer comprises a light-impermeable metal film laminated on an opposite end of the n-layer.

3. The LED display element according to claim 2, wherein each of the p-electrodes comprises a p-contact layer in contact with the p-layer and the low-reflection layer laminated on the p-contact layer.

4. The LED display element according to claim 3, wherein a total thickness of the low-reflection layer laminated on the p-contact layer is larger than a thickness of the p-contact layer.

5. The LED display element according to claim 3, wherein the p-contact layer comprises a transparent conductive oxide, and a layer in the low-reflection layer closest to the p-contact layer is the light-transmitting metal film.

6. The LED display element according to claim 2, wherein the n-electrode comprises an n-contact layer in contact with the n-layer and the low-reflection layer laminated on the n-contact layer.

7. The LED display element according to claim 6, wherein a total thickness of the low-reflection layer laminated on the n-contact layer is larger than a thickness of the n-contact layer.

8. The LED display element according to claim 6, wherein the n-contact layer comprises a metal, and a layer in the low-reflection layer closest to the n-contact layer is the transparent conductive film.

9. The LED display element according to claim 8, wherein a thickness of the light-transmitting metal film constituting the low-reflection layer laminated on the n-contact layer is larger than a thickness of the n-contact layer.

10. The LED display element according to claim 1, wherein a thickness of the light-transmitting metal film closest to the n-layer is smaller than a thickness of the transparent conductive film closest to the n-layer.

11. The LED display element according to claim 1, wherein each of the p-electrodes comprises a p-contact layer in contact with the p-layer and the low-reflection layer laminated on the p-contact layer.

12. The LED display element according to claim 11, wherein a total thickness of the low-reflection layer laminated on the p-contact layer is larger than a thickness of the p-contact layer.

13. The LED display element according to claim 11, wherein the p-contact layer comprises a transparent conductive oxide, and a layer in the low-reflection layer closest to the p-contact layer is the light-transmitting metal film.

14. The LED display element according to claim 1, wherein the n-electrode comprises an n-contact layer in contact with the n-layer and the low-reflection layer laminated on the n-contact layer.

15. The LED display element according to claim 14, wherein a total thickness of the low-reflection layer laminated on the n-contact layer is larger than a thickness of the n-contact layer.

16. The LED display element according to claim 14, wherein the n-contact layer comprises a metal, and a layer in the low-reflection layer closest to the n-contact layer is the transparent conductive film.

17. The LED display element according to claim 16, wherein a thickness of the light-transmitting metal film constituting the low-reflection layer laminated on the n-contact layer is larger than a thickness of the n-contact layer.

18. The LED display element according to claim 1, wherein the transparent conductive film comprises ITO or IZO.

19. The LED display element according to claim 1, wherein the light-transmitting metal film comprises at least one selected from Cr, Ir, Mo, Ni, Pt, Rh, Ta, Ti, V, W and TIN.

20. A method of manufacturing the LED display element according to claim 1, the method comprising:

a combination setting step of setting a plurality of combinations for thicknesses of respective layers included in the low-reflection layer;

an integration step of integrating, for the plurality of combinations, reflectance of the p-electrode or the n-electrode provided with the low-reflection layer in a wavelength range of 400 nm to 700 nm and an incident angle range of 0° to 16°;

a minimum integrated value extraction step of extracting a minimum integrated value from a plurality of integrated values obtained in the integration step;

a combination extraction step of extracting the combination corresponding to an integrated value equal to or less than twice the minimum integrated value in the plurality of integrated values obtained in the integration step; and a forming step of forming the respective layers so that the thicknesses of the respective layers correspond to the combination extracted in the combination extraction step.

* * * * *